(12) United States Patent
Nakashima et al.

(10) Patent No.: US 9,743,557 B2
(45) Date of Patent: Aug. 22, 2017

(54) AMPLIFIER MODULE WITH ENHANCED HEAT DISSIPATING FUNCTION AND SEMICONDUCTOR DEVICE

(71) Applicant: Sumitomo Electric Device Innovations, Inc., Yokohama-shi (JP)

(72) Inventors: Ikuo Nakashima, Yokohama (JP); Naoto Murata, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/837,834

(22) Filed: Aug. 27, 2015

(65) Prior Publication Data

US 2016/0065145 A1    Mar. 3, 2016

(30) Foreign Application Priority Data

Aug. 29, 2014 (JP) .................. 2014-175050

(51) Int. Cl.
*H05K 7/20* (2006.01)
*H01L 23/055* (2006.01)
*H01L 23/367* (2006.01)
*H01L 23/498* (2006.01)

(52) U.S. Cl.
CPC .......... *H05K 7/205* (2013.01); *H01L 23/055* (2013.01); *H01L 23/3677* (2013.01); *H01L 23/49827* (2013.01); *H01L 23/49844* (2013.01); *H01L 2224/48091* (2013.01); *H01L 2224/48137* (2013.01); *H01L 2224/48227* (2013.01); *H03F 2200/447* (2013.01)

(58) Field of Classification Search
CPC .................. H05K 7/205; H01L 23/055; H01L 2224/48091; H01L 2224/48227; H01L 2224/48137; H01L 2924/00014; H03F 2200/447
See application file for complete search history.

(56) References Cited

U.S. PATENT DOCUMENTS

2011/0175136 A1*  7/2011  Lin .................. H01L 21/486
                                                    257/99
2015/0381122 A1*  12/2015  Musa ................ H01L 28/20
                                                    330/291

FOREIGN PATENT DOCUMENTS

JP         2005-044855 A        2/2005

* cited by examiner

*Primary Examiner* — Yasser A Abdelaziez
(74) *Attorney, Agent, or Firm* — Venable LLP; Michael A. Sartori; F. Brock Riggs

(57) ABSTRACT

An amplifier module having a surface-mounting carrier with a base and lid is disclosed. The base in a top surface thereof provides a die pad on which a transistor is mounted, and a back surface thereof provides a back pad electrically and thermally connected to the die pad. The back pad has an area wider than the area of the die pad. The heat conduction from the transistor to the host board on which the amplifier module is mounted is effectively enhanced.

12 Claims, 8 Drawing Sheets

AMPLIFIER MODULE WITH ENHANCED HEAT DISSIPATING FUNCTION AND SEMICONDUCTOR DEVICE

BACKGROUND OF THE INVENTION

1. Filed of the Invention

The present application relates to a semiconductor device, and in particular, the present application relates to a semiconductor device implementing a transistor capable of outputting high power.

2. Background Arts

An amplifier module that provides a semiconductor active device, such as a transistor made of compound semiconductor materials, mounted on a substrate has been well known. The amplifier module provides a substrate having a die-pad on a top surface thereof to mount the transistor, and a pad in a back surface thereof. The die-pad in the top surface and the pad in the back surface often have planar shapes similar to, or substantially same with the others.

Such an amplifier module has been continuously requested to output high power signal. There exists a trend to replace the transistor in the amplifier module from those made of gallium arsenide (GaAs) to recently developed transistor made of gallium nitride (GaN). However, a practical module is not available by merely replacing a GaAs transistor to a GaN transistor. The use of a GaN transistor is necessary to take the power consumption of the device, namely, the heat dissipation of the device, into account.

SUMMARY

One aspect of the present application relates to an amplifier module that comprises a base and a transistor. The base provides a die pad on a top surface thereof and a back pad on a back surface thereof. The die pad mounts the transistor thereof. A feature of the base of the present application is that the back pad has an elongated area extending to edges of the base opposite to each other.

Another aspect of the present application relates to a semiconductor device comprises an amplifier module and a host board that mounts the amplifier module thereon. A feature of the semiconductor device of the present invention is that the amplifier module has a leadless chip carrier package (LCCP) that includes a rectangular base and a rectangular lid, where the base and the lid forms a cavity into which a transistor is implemented. The base has a top surface and a back surface. The top surface provides a die pad, an input terminal, and an output terminal. The die pad mounts the transistor thereon. The back surface of the base provides an input pad, an output pad, and a back pad. The input pad is connected to the input terminal with a via metal. The output pad is connected to the output terminal with a via metal. The back pad is connected to the die pad with a via metal. A feature distinguishable from prior semiconductor devices is that the back pad of the base has edges not facing the input and output pads, respectively, elongated to respective edges of the base opposite to each other.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Explanation of an Embodiment of the Present Invention

Next, some embodiments according to the present invention will be described as referring to drawings. However, it will be evident that various modifications and changes may be made without departing from the broader spirit and scope of the present invention. The present specification and figures are accordingly to be regarded as illustrative rather than restrictive.

First Embodiment

Figure 1A:
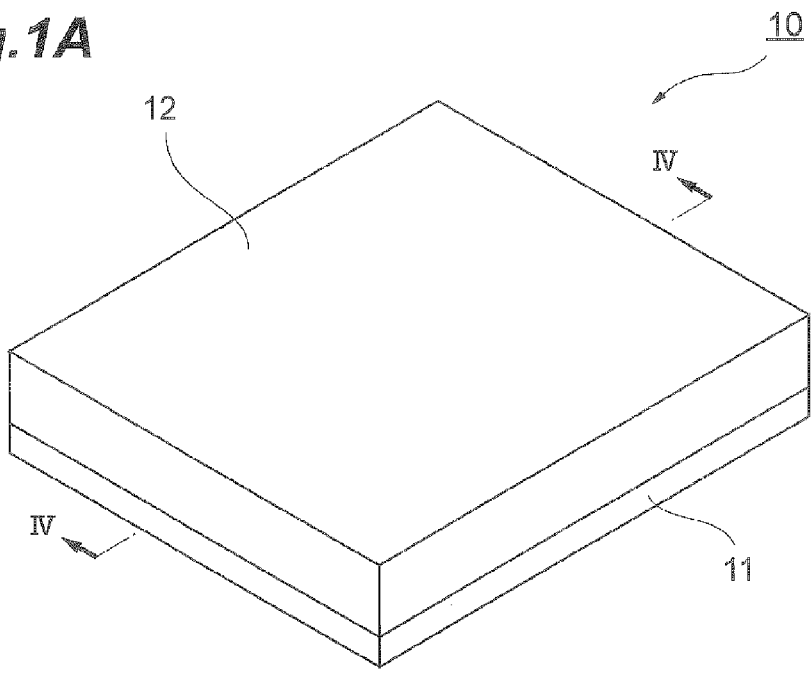
FIG. 1A is a perspective view showing an amplifier module according to an embodiment of the present invention.
Figure 1B:
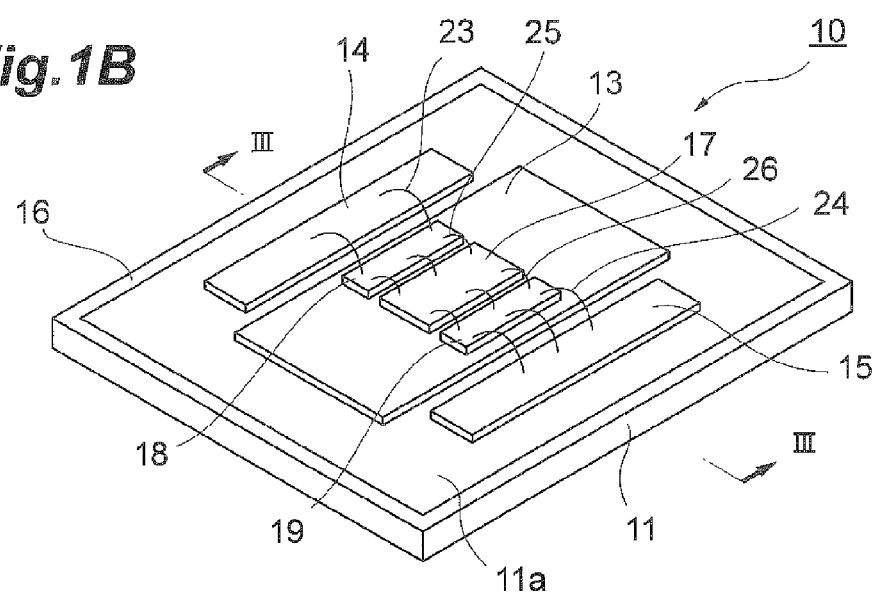
FIG. 1B removes a lid of the amplifier module to show an inside thereof.
Figure 2:
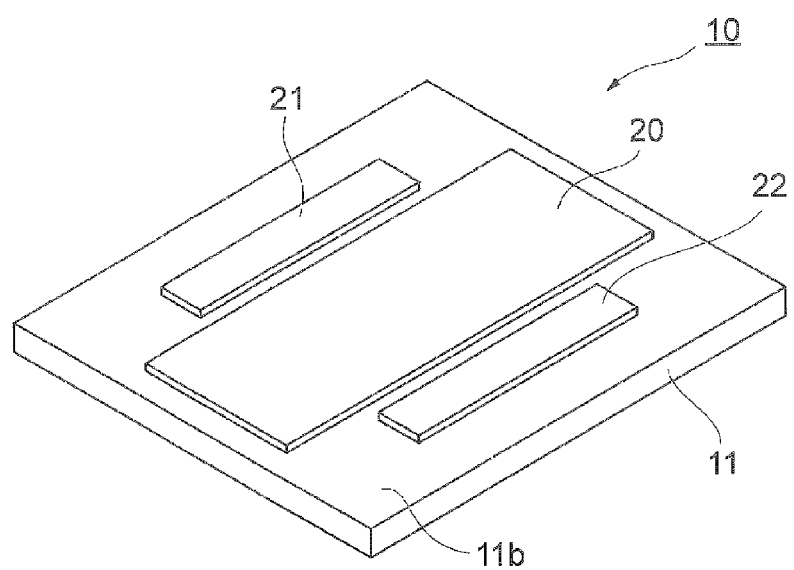
FIG. 2 is a perspective view showing a back surface of the base in the amplifier module illustrated in FIG. 1B.
Figure 3:
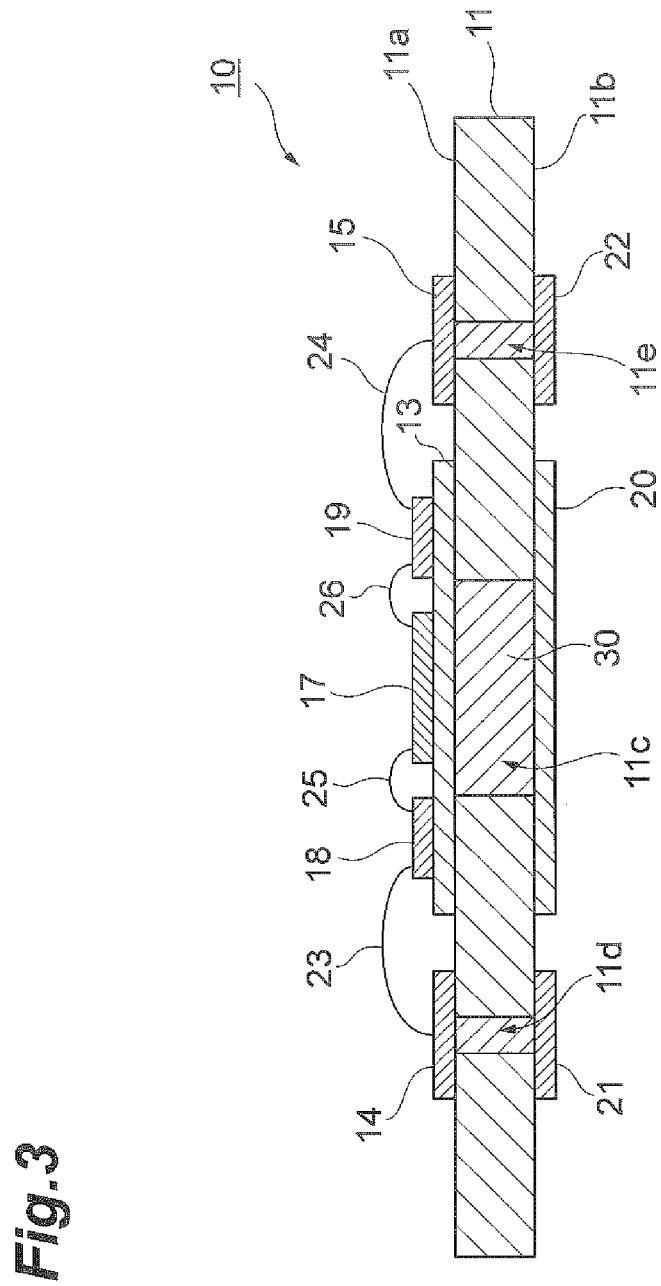
FIG. 3 is a cross section of the base taken along the line III-III appearing in FIG. 1B.
Figure 4:
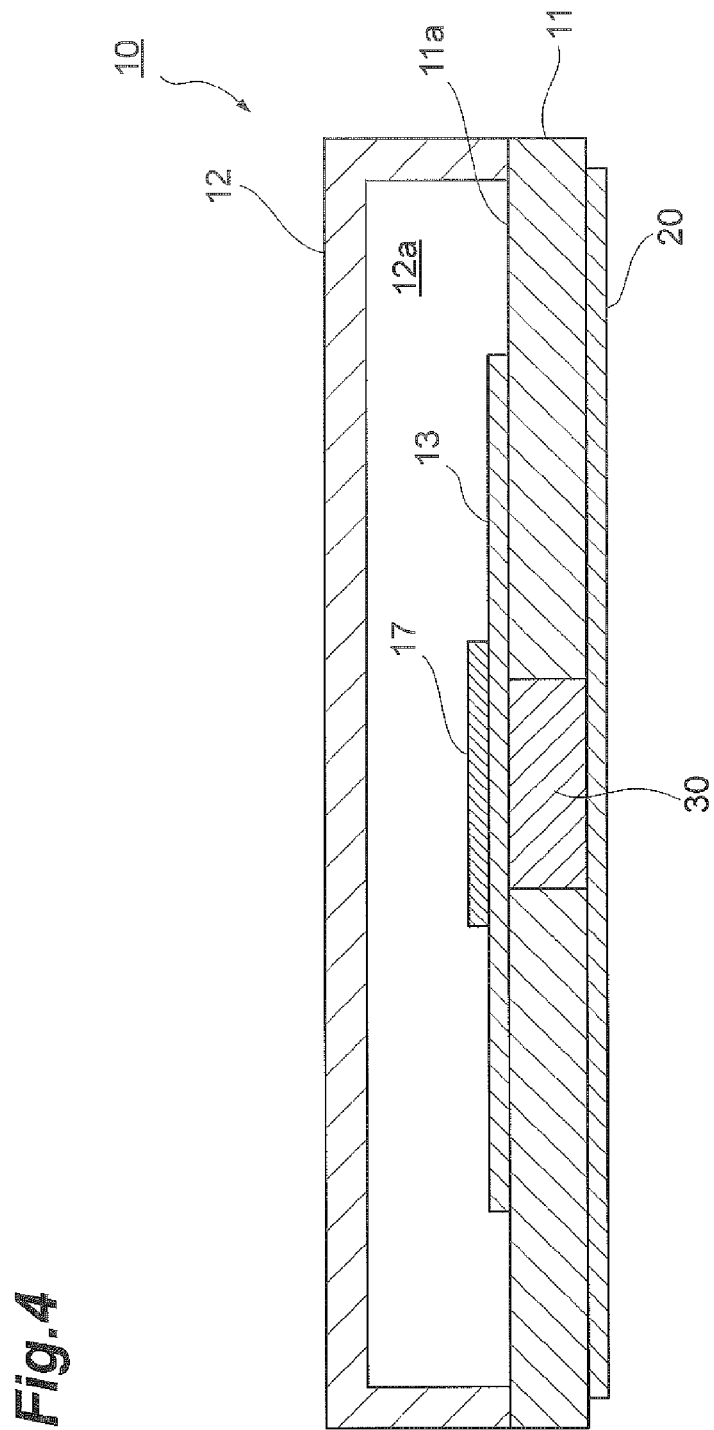
FIG. 4 is a cross section of the amplifier module taken along the line IV-IV appearing in FIG. 1A.

FIG. 1A is an outer appearance of an amplifier module 10 according to the first embodiment of the present invention, and FIG. 1B removes a lid shown in FIG. 1A to show an inside of the amplifier module 10. FIG. 2 shows a back surface of the base 11, FIG. 3 shows a cross section taken along the line III-III indicated in FIG. 1B, and FIG. 4 is a cross section of the amplifier module 10 taken along the line IV-IV indicated in FIG. 1A.

The amplifier module 10 of the present embodiment provides a base 11 and a lid 12, where the base 11 and the lid 12 forms a cavity into which a transistor 17 is air-tightly enclosed. The base 11 provides a die pad 13, an input terminal 14, output terminal 15, a seal metal 16, a transistor 17, an input matching circuit 18, and an output matching circuit 19 in the top surface 11a thereof. The base 11 also provides a back pad 20, an input pad 21, and an output pad 22 in the back surface 11b thereof. The back pad 20 is often called as the ground pad 20 because of the connection to the ground.

The base 11, which may be made of ceramics including, for instance, aluminum oxide ($Al_2O_3$), has a rectangular plane shape having the top surface 11a and the back surface 11b. The base 11, as shown in FIG. 3, provides via holes, 11c to 11e. The center via hole 11c, which may be filled with metal or metals containing gold (Au) and/or copper (Cu), connects the die pad 13 in the top surface 11a to the ground pad 20 as a back pad in the back surface 11b. The via hole 11d, which may be also filled with a metal, connects the input terminal 14 to the input pad 21, and the last via hole 11e, which may be also filled with a metal, connects the output terminal 15 to the output pad 22. The die pad 13 is connected with the back pad 20 not only electrically but thermally.

The lid 12, which may be made of ceramics or plastics and put on the base 11, forms a cavity 12a into which the die pad 13, the input and output terminals, 14 and 15, and the transistor 17, the input and output matching circuits, 18 and 19, where they are provided on the die pad 13, are air-tightly enclosed. The base 11 provides a seal ring 16 along four edges of the base 11 to mount the lid 12 thereon. The seal ring 16 may be made of metal or resin, for instance, epoxy resin. Applying epoxy resin in respective peripheries, placing the lid 12 on the epoxy resin, thermo-curing the epoxy resin 16, the lid 12 may air-tightly seal the cavity 12a. One alternative of the lid 12 is to surround or seal elements on the top surface 11a of the base directly by resin, which is often called as potting resin.

The die pad 13, as described above, mounts the transistor 17, the input and output matching circuits, 18 and 19, thereon. The base 11 provides the die pad 13 substantially in a center of the top surface 11a thereof, and the input and output terminals, 14 and 15, are arranged along the die pad 13 and putting the die pad 13 therebetween. Thus, the die pad 13, and the input and output terminals, 14 and 15, extend substantially in parallel along a direction of the base 11. The die pad 13, and the input and output terminals, 14 and 15, may include a stacked metal with a plated gold (Au) or a plated copper (Cu) in the topmost layer of the stacked metal. The input and output matching circuits, 18 and 19, are electrically connected with the input and output terminals, 14 and 15, with bonding wires, 23 and 24, respectively.

The transistor 17, which may be primarily made of nitride semiconductor materials, such as gallium nitride (GaN), has a type of the field effect transistor (FET). A GaN-FET enables the amplifier module 10 to be operable in microwave region with high power. The present invention may provide the transistor 17 primarily made of gallium arsenide (GaAs). The transistor 17 is electrically connected with the input and output matching circuits, 18 and 19, with bonding wires, 25 and 26, respectively. The base 11 and the lid 12 thus configured forms a leadless chip carrier package (LCCP).

The amplifier module 10 is mounted on a host board and so on by soldering the back pad 20 to a pad provided in the host board. The back pad 20 is arranged in a center of the back surface 11b of the base 11 and electrically and thermally connected to the die pad 13 on the top surface 11a of the base 11 by via metals 30 passing a center of the base 11. Thus, the back pad 20 may operate as a heat conducting path from the transistor 17 to the host board. The back pad 20 accompanies with the input and output pads, 21 and 22, in respective sides of the back pad 20. These pads, namely, the back pad 20 and the input and output pads, 21 and 22, also may be made of a stacked metal with a plated gold or a plated copper in the top thereof. The input and output pads, 21 and 22, correspond to the input and output terminals, 14 and 15, in the top surface 11a of the base 11. That is, the input and output terminals, 21 and 22, are connected to the input and output terminals, 14 and 15, respectively, have the plane shape substantially same with the plane shape of the input and output terminals, 14 and 15, and arranged in positions with respect to the back pad 20 substantially same with the positions of the input and output terminals, 14 and 15, with respect to the die pad 13.

As for the back pad 20, as illustrated in FIG. 2, the back pad 20 has a width along a direction connecting the input and output terminals, 21 and 22, substantially same with a width of the die pad 13 along the direction. However, the back pad 20 has a specific length, an elongated length, along a direction perpendicular to the former direction, that is the direction along which the input and output terminals, 21 and 22, extend. The elongated length of the back pad 20 is longer than the length of the die pad 13 such that the back pad 20 extends close to respective edges of the base 11 opposite to each other so as to overlap with the edge of the lid 12. When the die pad 13 and the back pad 20 are formed by plating, the plating process is necessary to prepare masks for the die pad 13 and the back pad 20 different from each other because two pads, 13 and 20, have areas different from each other.

In order to further enhance the heat conducting efficiency from the transistor 17 to the host board 40 in the amplifier module 10, production of a wider or a larger base to mount the transistor 17 and to provide the die pad 13 and the back pad 20 is a most simple method. However, a widened base inevitably accompanies with a widened lid, which is ineffective and contrary to a continuous request to make a semiconductor module in simple and compact. The present invention provides an arrangement of the back pad 20 provided in the back surface 11b of the base 11 to enhance the heat dissipating function without enlarging the size of the module.

Figure 5:
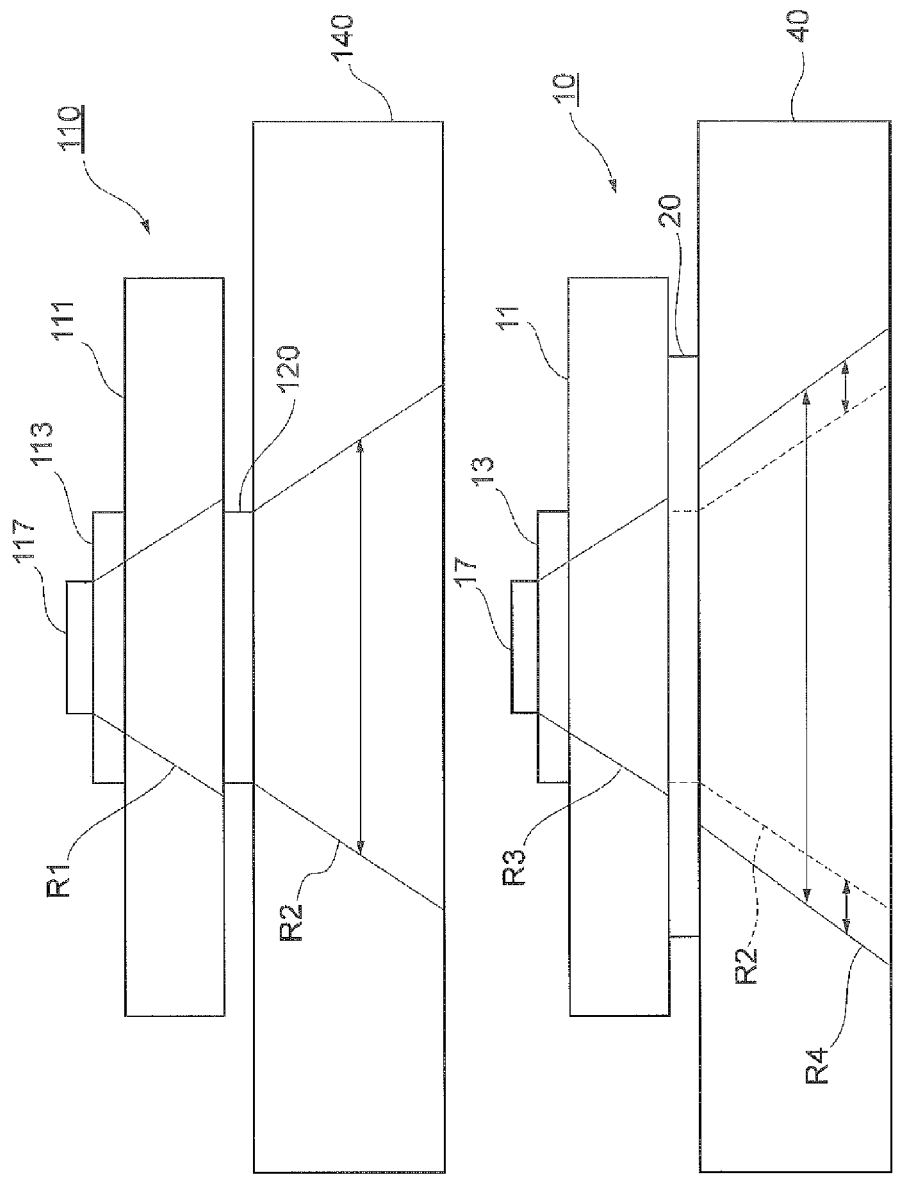
FIG. 5A schematically explains the heat conducting region from the transistor to the host board according to a conventional amplifier module.
FIG. 5B schematically illustrates the heat conducting region of the amplifier module according to the present invention.

The heat dissipating function of the amplifier module of the present invention will be described as comparing FIG. 5B with FIG. 5A, where FIG. 5A schematically shows a heat conducting path of a conventional arrangement while FIG. 5B also schematically shows a cross section of the heat conducting path of the present embodiment.

In the conventional arrangement of an amplifier module 110, the back pad 120 has a length substantially equal to a length of the die pad 113 along the direction. The heat generated by the transistor 117 mounted of the die pad 113 radially spreads toward the back pad 120 as forming a heat conducting region R1. The conventional arrangement provides the back pad 120 with the length substantially equal to the length of the die pad 113, only the heat reaching the back pad 120 is conducted to a wall of a host board 140 as radially spreading from the back pad 120. Radially spreading heat reaching the back pad 120 is not wholly conducted to the host board 140. Only a portion of the heat whose traces overlaps with the back pad 120 may be transferred to the host board 140 as forming a restricted heat conducting region R2 in the wall of the host board 140.

On the other hand, the present amplifier module 10 provides the back pad 20, whose length extends to the periphery of the base 11 along the direction, may conduct the heat generated by the transistor 17 on the die pad 13 and radially spreading toward the back pad 20 within the base 11 as forming the heat conducting region R3. However, the back pad 20, distinguishable from the conventional arrangement, may receive all of the heat radially spreading in the base 11. Thus, the heat radially spreading in the heat conducting region R3 in the base 11 is securely conducted to the host board 40 through the back pad 20, and the host board 40 may dissipate heat externally as forming the heat conducting region R4 which is expanded from that R2 in the conventional arrangement. Thus, the amplifier module 10 of the present invention may dissipate heat generated by the transistor 17 effectively and securely outside of the host board 40.

Modification

Figure 6:
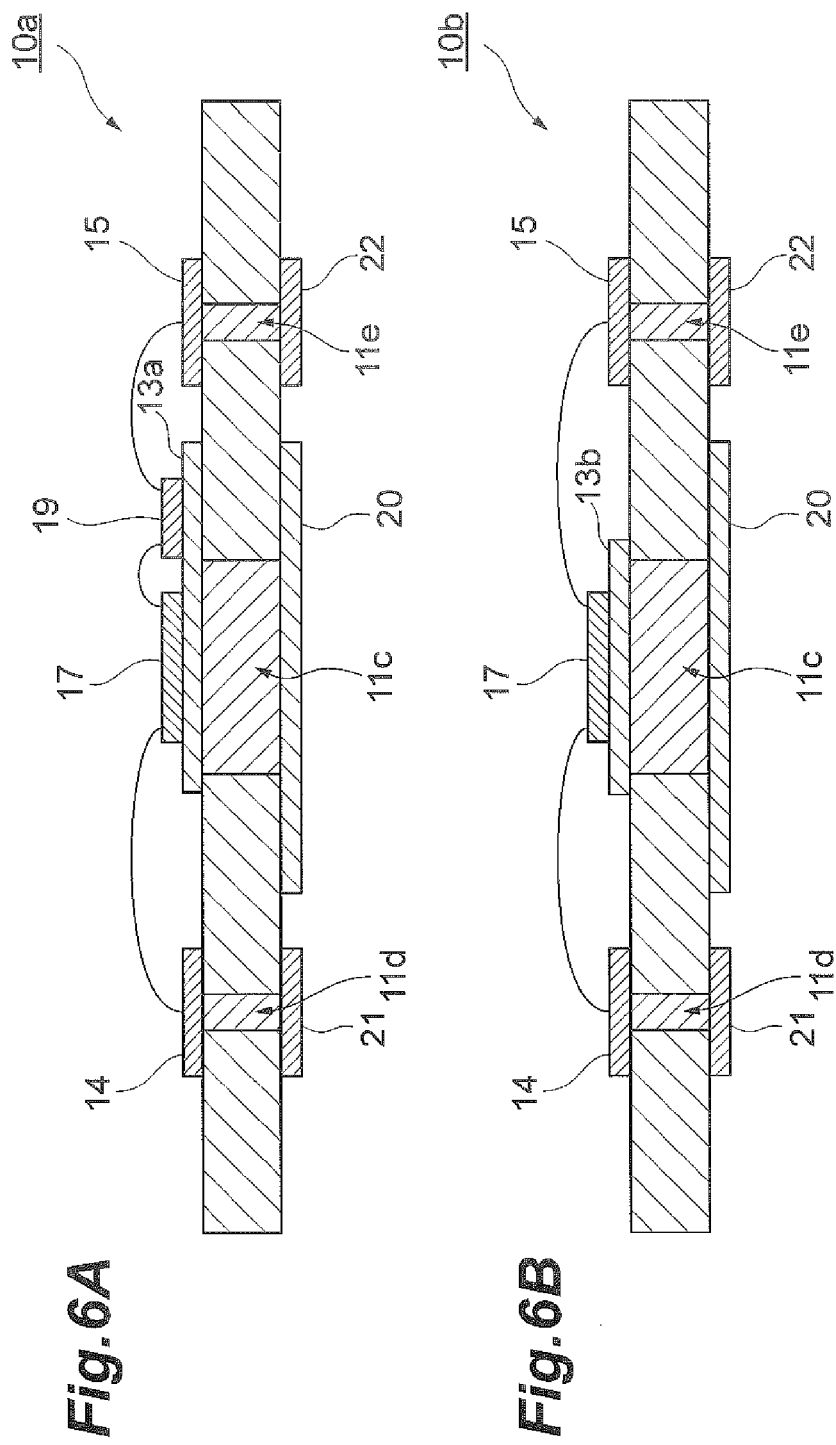
FIG. 6A shows a cross section of an amplifier module modified from the amplifier module shown in FIGS. 1A and 1B.
FIG. 6B shows a cross section of an amplifier module still modified from that shown in FIGS. 1A and 1B.

Next, some modifications of the first embodiment will be described as referring to FIGS. 6A and 6B showing cross sections of modified amplifier modules, 10a and 10b. As shown in FIG. 6A, the modified amplifier module 10a removes the input matching circuit 18 and areas of the die pad 13a corresponding to the input matching circuit 18. Thus, the width of the die pad 13a is shortened. However, the back pad 20 in the width thereof is unchanged so as to cover an area under the input matching circuit 18. Conventionally, the back pad 20 was usually cut in the area under the input matching circuit 18 when the input matching circuit 18 is moved outside of the amplifier module 10. That is, the back pad 20 of the modified amplifier module 10a has the width greater than the width of the die pad 13a in the top surface 11a of the base 11. The heat conducting area R1 within the base 11 may be unchanged from the embodiment shown in FIG. 5B.

The modified amplifier module 10b shown in FIG. 6B further removes the output matching circuit 19, that is, the output matching circuit 19 is moved outside of the amplifier module 10b. Accordingly, the die pad 13b has a shortened width. Conventional amplifier module usually cuts a portion of the back pad 20 corresponding to the output matching circuit 19, but the modified amplifier module 10b leaves the portion of the back pad 20 to maintain the heat dissipating function. Thus, the back pad 20 of the modified amplifier module 10b shows the heat dissipating function substantially same with that of the embodiment shown in FIGS. 1 and 2.

Second Embodiment

Figure 7:
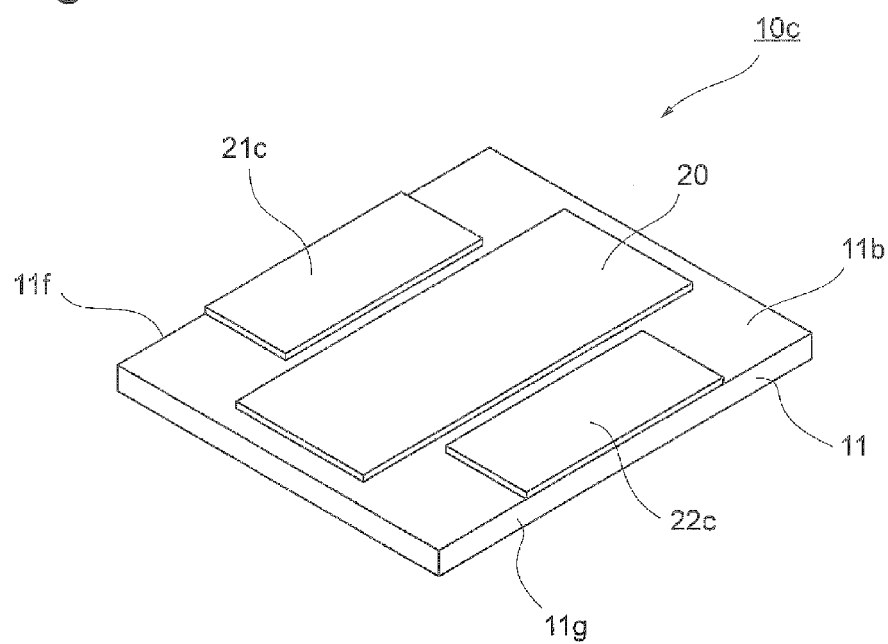
FIG. 7 is a perspective view of the back surface of the base according to the second embodiment of the present invention.

FIG. 7 is a perspective view showing the back surface of the base 11b according to the second embodiment of the invention. The amplifier module 10c of the second embodiment has features distinguishable from the former embodiment in the input pad 21c and the output pad 22c. Arrangements rest of the input and output pads, 21c and 22c, are the same with those of the aforementioned embodiment.

The input and output pads, 21c and 22c, of the second embodiment extend to respective edges, 11f and 11g, of the base 11. Expanded pads, 21c and 22c, may enhance the bond strength of the amplifier module 10c on the host board 40. Moreover, solder may spread on the sides of the amplifier module 10c, and the bonding quality by the solder may be easily checked.

Third Embodiment

Figure 8:
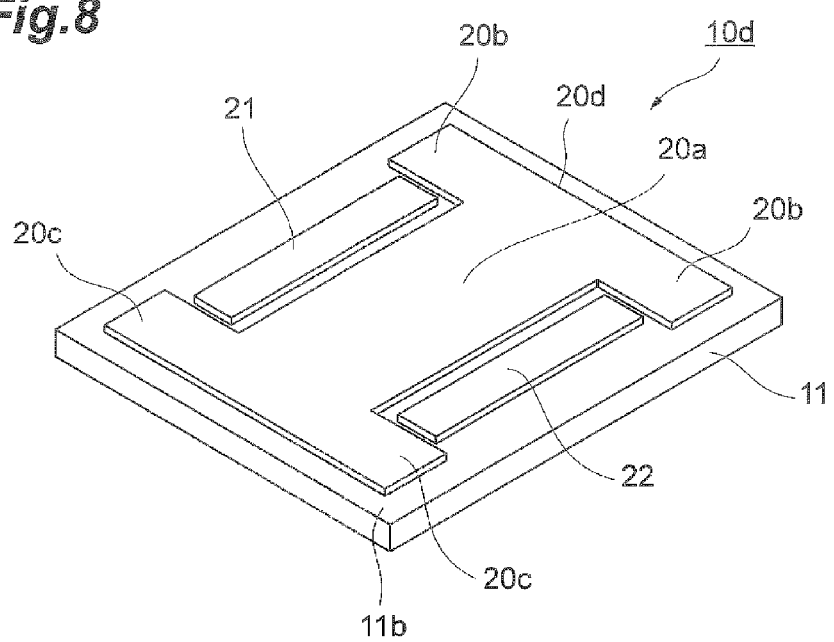
FIG. 8 is a perspective view of the back surface of the base according to the third embodiment of the present invention.

FIG. 8 is a perspective view showing the back surface 11b of the amplifier module 10d according to the third embodiment of the invention. The third embodiment has a back pad 20d distinguishable from the aforementioned back pads. Other arrangements except for the back pad 20d are the same with those of the embodiments.

The back pad 20d of the third embodiment provides a rectangular primary area 20a and extended areas, 20b and 20c, extending from respective corners of the primary area 20a along the direction connecting the input and output pads, 21 and 22. The extended areas, 20b and 20c, surround the input pad 21 and the output pad 22 in three directions thereof accompanied with the primary area 20a. For the direction perpendicular to the above direction, the primary area 20a and the extended areas, 20b and 20c, extend to respective peripheries of the base 11. Thus, the back pad 20d of the present embodiment expands the area thereof by those corresponding to the extended areas, 20b and 20c, compared with the back pad 20 of the first embodiment. Accordingly, the amplifier module 10d may further enhance the heat dissipating function. Moreover, the expanded back pad 20d may enhance the bond strength of the amplifier module 10d against the host board 40.

The extended areas, 20b and 20c, surrounding the input pad 21 and the output pad 22 accompanied with the primary area 20a may effectively isolate the input pad 21 and the output pad 22 from circuits provided on the host board 40, which results in superior performance of the amplifier module 10d.

While particular embodiments of the present invention have been described herein for purposes of illustration, many modifications and changes will become apparent to those skilled in the art. For instance, the specification described above concentrates the transistor 17 with a type of the field effect transistor (FET). However, the amplifier module may implement other types of transistors, such as, a hetero-bipolar transistor (HBT), and so on. Accordingly, the appended claims are intended to encompass all such modifications and changes as fall within the true spirit and scope of this invention.

What is claimed is:

1. An amplifier module, comprising:
   a base providing a die pad on a top surface thereof and a back pad on a back surface thereof, the die pad being electrically and thermally connected to the back pad;
   a transistor mounted on the die pad; and
   a lid configured to form a cavity where the transistor and the die pad are enclosed therein,
   wherein the back pad in the back surface has an area elongated to edges of the base opposite to each other,
   wherein the back pad extends in an area of the back surface corresponding to an area of the top surface where the lid is fixed to the base, and
   wherein the area where the lid is attached to the base coincides with the periphery of the base.
2. The amplifier module of claim 1,
   wherein the back pad extends to an edge of the base.
3. The amplifier module of claim 1,
   wherein the lid has plane dimensions coinciding with plane dimensions of the base.
4. An amplifier module, comprising:
   a base providing a die pad on a top surface thereof and a back pad on a back surface thereof, the die pad being electrically and thermally connected to the back pad;
   a transistor mounted on the die pad; and
   a lid configured to form a cavity where the transistor and the die pad are enclosed therein,
   wherein the back pad in the back surface has an area elongated to edges of the base opposite to each other,
   wherein the back pad extends in an area of the back surface corresponding to an area of the top surface where the lid is fixed to the base, and
   wherein the die pad provides an input matching circuit thereon, and the back pad provides a portion overlapping with an area of the die pad on which the input matching circuit is mounted.

5. An amplifier module, comprising:
a base providing a die pad on a top surface thereof and a back pad on a back surface thereof, the die pad being electrically and thermally connected to the back pad;
a transistor mounted on the die pad; and
a lid configured to form a cavity where the transistor and the die pad are enclosed therein,
wherein the back pad in the back surface has an area elongated to edges of the base opposite to each other,
wherein the back pad extends in an area of the back surface corresponding to an area of the top surface where the lid is fixed to the base, and
wherein the die pad provides an output matching circuit thereon, and the back pad provides a portion overlapping with an area of the die pad on which the output matching circuit is mounted.

6. The amplifier module of claim 1,
wherein the base is made of ceramics.

7. The amplifier module of claim 4,
wherein the back pad extends to an edge of the base.

8. The amplifier module of claim 4,
wherein the lid has plane dimensions coinciding with plane dimensions of the base.

9. The amplifier module of claim 4,
wherein the base is made of ceramics.

10. The amplifier module of claim 5,
wherein the back pad extends to an edge of the base.

11. The amplifier module of claim 5,
wherein the lid has plane dimensions coinciding with plane dimensions of the base.

12. The amplifier module of claim 5,
wherein the base is made of ceramics.

\* \* \* \* \*